United States Patent [19]
Suzuki et al.

[11] Patent Number: 5,155,436
[45] Date of Patent: Oct. 13, 1992

[54] METHOD AND APPARATUS FOR STABILIZING UNIFORMITY OF STATIC MAGNETIC FIELD IN MAGNETIC RESONANCE IMAGING APPARATUS

[75] Inventors: Katsunori Suzuki; Tsuneo Maeda; Motonari Nasuhara; Shigeru Sato, all of Kashiwa, Japan

[73] Assignee: Hitachi Medical Corporation, Tokyo, Japan

[21] Appl. No.: 650,596

[22] Filed: Feb. 5, 1991

[30] Foreign Application Priority Data

Feb. 9, 1990 [JP] Japan .................................. 2-28368

[51] Int. Cl.$^5$ .............................................. G01V 3/00
[52] U.S. Cl. .................................... 324/320; 324/318
[58] Field of Search ............... 324/320, 319, 318, 322, 324/307, 309; 128/653 SC; 335/284, 296, 302, 306

[56] References Cited

U.S. PATENT DOCUMENTS

| | | | |
|---|---|---|---|
| 4,633,179 | 12/1986 | Sugimoto | 324/307 |
| 4,924,186 | 5/1990 | Kawamoto et al. | 324/320 |
| 4,980,641 | 12/1990 | Breneman et al. | 324/318 |
| 5,061,897 | 10/1991 | Danby et al. | 324/318 |

*Primary Examiner*—Louis Arana
*Attorney, Agent, or Firm*—Antonelli, Terry, Stout & Kraus

[57] ABSTRACT

Method and apparatus of stabilizing uniformity of a static magnetic field in a magnetic resonance imaging apparatus, wherein before adjustment of uniformity of the static magnetic field and before each actual imaging operation, pulse-like gradient magnetic fields are applied to a static magnetic field generating magnetic circuit at a maximum output level of power supplies for generation of gradient magnetic fields so as to magnetize the static magnetic field generating magnetic circuit to constant magnetization intensity.

18 Claims, 6 Drawing Sheets

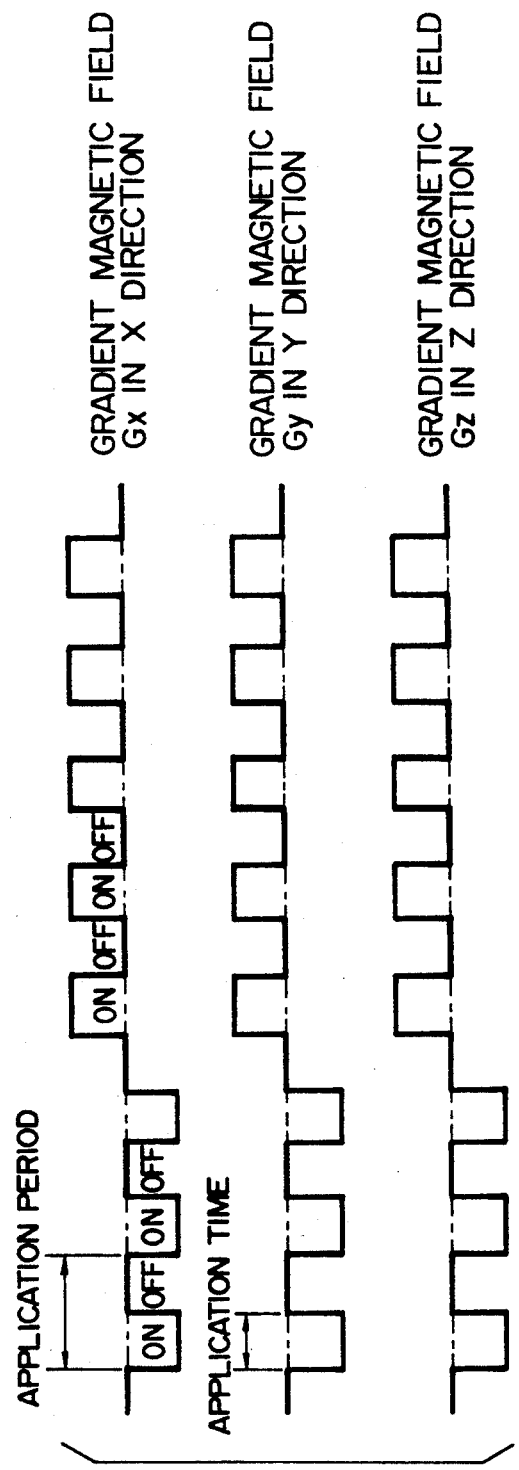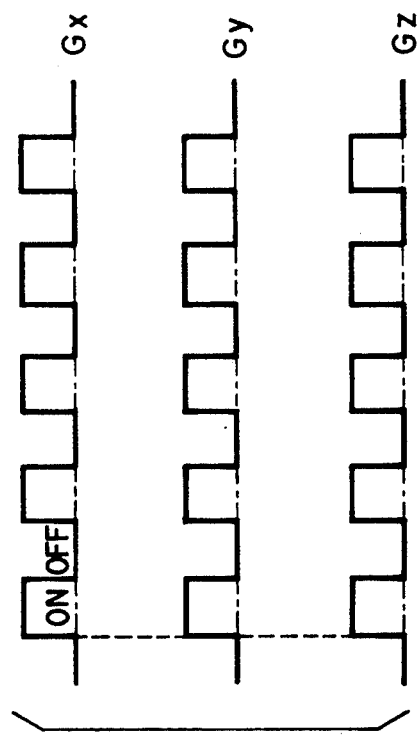

METHOD AND APPARATUS FOR STABILIZING UNIFORMITY OF STATIC MAGNETIC FIELD IN MAGNETIC RESONANCE IMAGING APPARATUS

BACKGROUND OF THE INVENTION

This invention relates to method and apparatus of stabilizing uniformity of a static magnetic field in a magnetic resonance imaging apparatus which makes use of a nuclear magnetic resonance (hereinafter simply referred to as "NMR") phenomenon to obtain a tomographic image of a desired part of an object under examination (human body).

The magnetic resonance imaging apparatus utilizes the NMR phenomenon by applying a static magnetic field and gradient magnetic fields to an object to be examined to measure a density distribution, a relaxation time distribution and the like of a nuclear spin at a desired examination part of the examined object and display an image of a desired slice of the examined object on the basis of measured data.

A static magnetic field generating magnetic circuit serving as means for generating the aforementioned static magnetic field has a specific construction as shown in FIGS. 6 and 7, having a pair of permanent magnets 21a and 21b opposing to each other to form a gap A into which an object 1 under examination is insertible, yokes 22a and 22b for supporting and magnetically coupling the permanent magnets 21a and 21b, columns 23 for coupling the yokes 22a and 22b, and magnetic pole pieces 24a and 24b respectively secured to the opposing surfaces, confronting the gap A, of the paired permanent magnets 21a and 21b and taking the shape of a disk-like magnetic member having an annular projection formed at its periphery, whereby a magnetic field is generated in the gap A. The magnetic pole pieces 24a and 24b are adapted to improve uniformity of the static magnetic field and made of a ferromagnetic material. FIG. 7 is a sectional view taken on the line I—I of FIG. 6, depicting gradient magnetic field coils designated at reference numeral 9.

With the magnetic resonance imaging apparatus constructed as above, when the static magnetic field in the apparatus is non-uniform, a tomographic image of the examined object 1 will be distorted. In other words, the better the uniformity of the static magnetic field, the more the distortion of a tomographic image obtained is lessened. Accordingly, in the past, during installation, maintenance or inspection of the magnetic resonance imaging apparatus, mechanical configuration and positional relation in the construction shown in FIGS. 6 and 7 are adjusted to achieve adjustment of uniformity of the static magnetic field.

Actually, however, when a phantom or an examination object used for adjustment and evaluation of the apparatus is imaged after completion of the adjustment of uniformity of the static magnetic field in the prior art magnetic resonance imaging apparatus, the resulting image is sometimes distorted. For example, when a phantom 25 of a lattice pattern as shown in FIG. 8 is set in the gap A shown in FIG. 7 and imaged, a tomographic image I as shown in FIG. 9A which the phantom 25 imaged without distortion in shape should take is sometimes distorted in effect, resulting in a tomographic image I' as shown in FIG. 9B. Conceivably, this is due to the fact that the gradient magnetic fields applied when imaging the phantom change the magnetization intensity of the magnetic pole pieces 24a and 24b forming part of the static magnetic field generating magnetic circuit, so that the uniformity of the static magnetic field is lost and the non-uniformity results.

The magnetic pole pieces 24a and 24b are made of the ferromagnetic material which has in general a magnetic hysteresis. An example of its hysteresis curve is illustrated in FIG. 10. In the figure, abscissa represents magnetic field intensity H externally applied to the ferromagnetic material and ordinate represents magnetization intensity M of the ferromagnetic material applied with the magnetic field intensity H. The magnetization intensity M of the ferromagnetic material changes with the magnetic field intensity H applied thereto to take values on the closed magnetic hysteresis curve shown in FIG. 10.

With the prior art magnetic resonance imaging apparatus, once the adjustment of the static magnetic field uniformity has been finished by adjusting the mechanical configuration and positional relation in the construction of the static magnetic field generating magnetic circuit upon installation, maintenance and inspection of the apparatus, ordinarily imaging is conducted. During each imaging operation, gradient magnetic fields of variously different intensity values are applied for variously different intervals of time. As a result, the magnetization intensity M of the magnetic pole pieces 24a and 24b taking, for example, a point A on the curve of FIG. 10 immediately after completion of the adjustment of the static magnetic field uniformity changes from the point A to, for example, a point B through a subsequent imaging operation and then changes from the point B to, for example, a point C through a further subsequent imaging operation. Thus, with the prior art magnetic resonance imaging apparatus, the magnetization intensity M of the magnetic pole pieces adapted to make uniform the static magnetic field changes along a loop L1 which is subject to a relatively large change, thereby preventing the static magnetic field uniformity from being stabilized. In consequence, the resulting tomographic image of the examined object is sometimes distorted and excellent diagnostic images cannot be obtained, thus degrading efficiency of diagnosis.

SUMMARY OF THE INVENTION

The present invention intends to solve the problems encountered in the prior art and its object is to provide method and apparatus of stabilizing uniformity of a static magnetic field in a magnetic resonance imaging apparatus so that less distorted tomographic images can be obtained by virtue of the stabilized uniformity of the static magnetic field.

To accomplish the above object, in method and apparatus for stabilization of uniformity of the magnetic resonance imaging apparatus static magnetic field according to the invention, predetermined gradient magnetic fields are applied to a static magnetic field generating magnetic circuit by means of a gradient magnetic field generating unit before adjustment of uniformity of a static magnetic field of the static magnetic field generating magnetic circuit and before each imaging operation for tomographic image of an object under examination so as to provide constant magnetization for the static magnetic field generating magnetic circuit.

Preferably, intensity of the predetermined gradient magnetic fields applied to the static magnetic field generating magnetic circuit may equal intensity which can be applied at a maximum output level of gradient magnetic field power supplies of the gradient magnetic field generating unit.

Further, the predetermined gradient magnetic fields applied to the static magnetic field generating magnetic circuit may initially have negative intensity and subsequently may have positive intensity to attain the effect that the magnetic pole pieces can always be magnetized at the same magnetization intensity.

According to the static magnetic field uniformity stabilizing method and apparatus of the invention, magnetization of the static magnetic field generating magnetic circuit when imaging the object under examination for tomographic image can always equal that obtained upon adjustment of the static magnetic field uniformity. Accordingly, the static magnetic field uniformity can be stabilized and images of less distortion can be obtained. This ensures that excellent diagnostic images can be obtained to improve efficiency of diagnosis with the magnetic resonance imaging apparatus.

BRIEF DESCRIPTION OF THE DRAWINGS

FIG. 2 is a timing chart showing the application operation of gradient magnetic fields in the method of the invention;

FIGS. 3 to 5 are timing charts showing other embodiments of the application operation of gradient magnetic fields;

DESCRIPTION OF THE PREFERRED EMBODIMENTS

Preferred embodiments of the invention will now be described with reference to the accompanying drawings.

Figure 1:
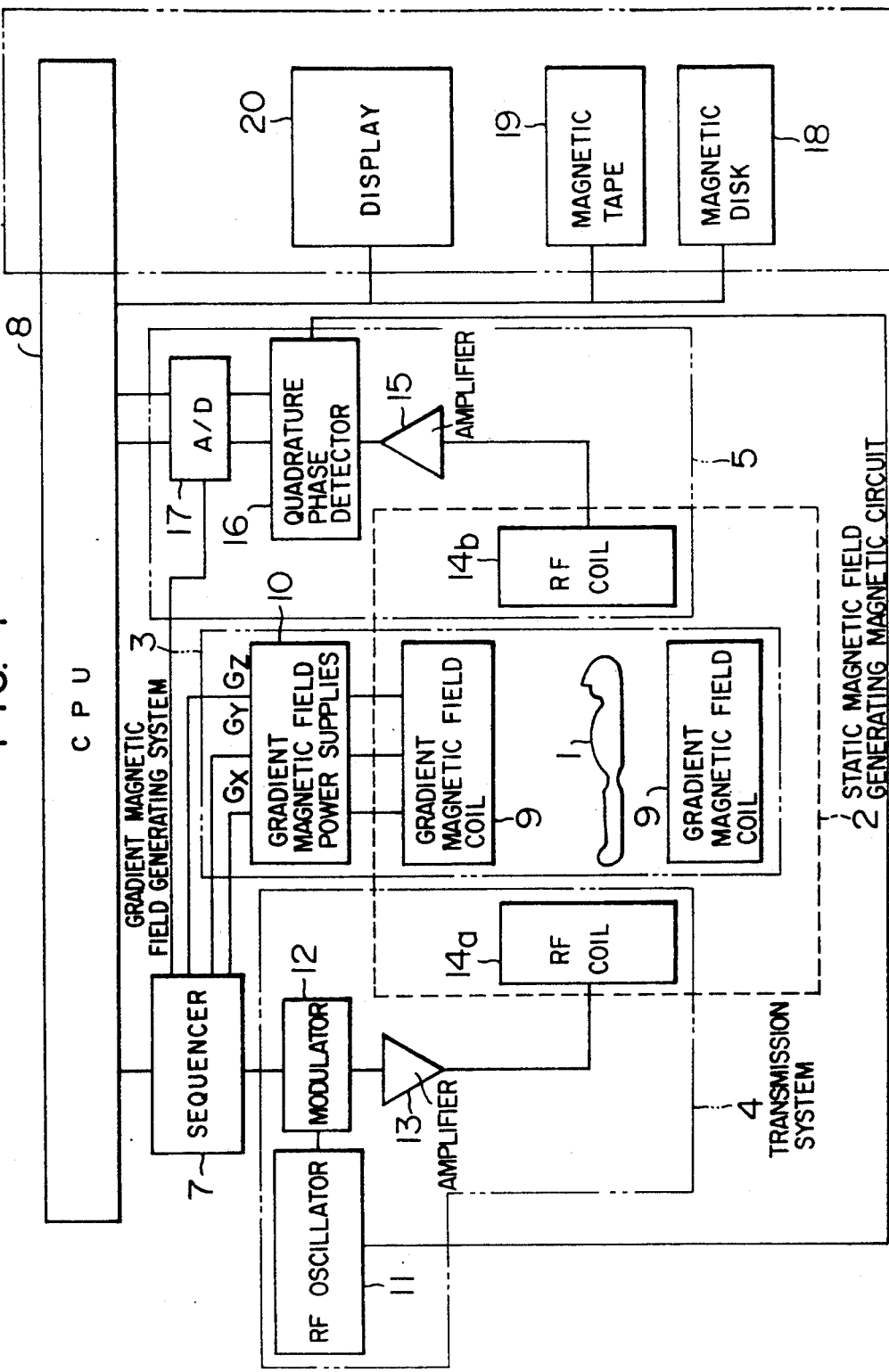
FIG. 1 is a block diagram illustrating the whole construction of a magnetic resonance imaging apparatus to which a static magnetic field uniformity stabilizing method according to the invention is applied.

FIG. 1 shows in block form the whole construction of a magnetic resonance imaging apparatus to which a static magnetic field uniformity stabilizing method according to the invention is applied. The magnetic resonance imaging apparatus makes use of an NMR phenomenon to obtain a tomographic image of an object under examination and it comprises as shown in FIG. 1 a static magnetic field generating magnetic circuit 2, a gradient magnetic field generating system 3, a transmission system 4, a receiving system 5, a signal processing system 6, a sequencer 7 and a central processing unit (CPU) 8.

The static magnetic field generating magnetic circuit 2 is adapted to generate a uniform static magnetic field around an object 1 to be examined (human body) in a direction of body axis or a direction orthogonal to the body axis and has magnetic field generating means of permanent magnet type arranged in a space somewhat spread to surround the object 1 under examination. The gradient magnetic field generating system 3 includes gradient magnetic field coils 9 wound three-dimensionally in directions of three axes X, Y and Z and gradient magnetic field power supplies 10 for driving the individual coils. In response to instructions from the sequencer 7, the gradient magnetic field power supplies 10 associated with the respective coils are driven so that gradient magnetic fields Gx, Gy and Gz in the directions of the three axes X, Y and Z may be applied to the object 1 to be examined. Depending on the manner of applying the gradient magnetic fields, a slice plane can be set with respect to the examined object 1. The transmission system 4 is adapted to irradiate a radio frequency (RF) signal on the examined object 1 in order to cause nuclear magnetic resonance in atomic nuclei of atoms constituting the biological tissue and it includes an RF oscillator 11, a modulator 12, an RF amplifier 13 and an RF coil 14a on the transmission side. An RF pulse delivered out of the RF oscillator 11 is subjected to amplitude modulation by means of the modulator 12 in accordance with an instruction from the sequencer 7, and the amplitude modulated RF pulse is amplified by the RF amplifier 13 and then supplied to the RF coil 14a arranged near the object 1 under examination to cause an electromagnetic wave to be irradiated on the examined object 1. The receiving system 5 is adapted to detect an echo signal (NMR signal) emitted under the influence of the nuclear magnetic resonance of atomic nuclei in the biological tissue of the examined object 1 and it includes an RF coil 14b on the receiving side, an amplifier 15, a quadrature phase detector 16 and an analog/digital (A/D) converter 17. An electromagnetic wave (NMR signal) generated from the examined object 1 in response to the electromagnetic wave irradiated from the RF coil 14a on the transmission side is detected by the RF coil 14b arranged near the examined object 1 and is then applied through the amplifier 15 and quadrature phase detector 16 to the A/D converter 17 where it is converted into a digital quantity. The digital quantity is then sampled by the quadrature phase detector 16 at timings pursuant to instructions from the sequencer 7 to provide collected data of two series of real number and imaginary number, and a signal representative of the data is sent to the signal processing system 6. The signal processing system 6 includes the CPU 8, a recording unit comprised of a magnetic disk 18 and a magnetic tape 19 and a display 20 such as a cathode ray tube (CRT). The CPU 8 carries out such processings as Fourier transform, correction coefficient calculation and image reconstruction to provide a signal intensity distribution on a desired slice or a distribution obtained by applying appropriate operations to a plurality of signals. The distribution is formed into an image which is displayed as a tomographic image on the display 20. The sequencer 7 is a unit which is operated under the control of the CPU 8 to send various instructions necessary for collecting data for the tomographic image of the examined object 1 to the transmission system 4, gradient magnetic field generating system 3 and receiving system 5 and to generate the sequence for measurement of the echo signal.

Various types of the gradient magnetic field coils 9 have been proposed but coils described in the specification of Japanese Patent Application Sho 61-207930 may preferably available.

Figure 7:
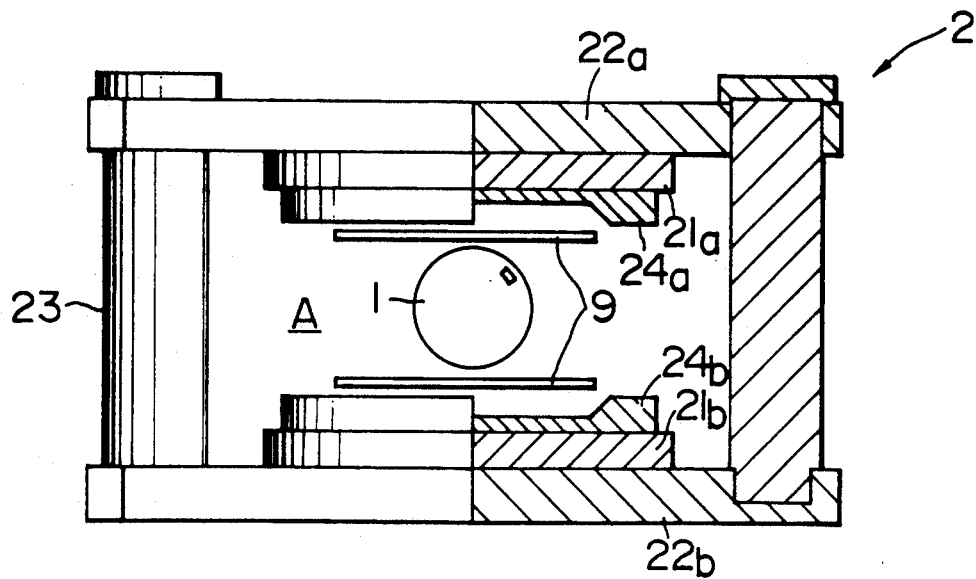
FIG. 7 is a front view, partly sectioned on the line I—I of FIG. 6.
Figure 8:
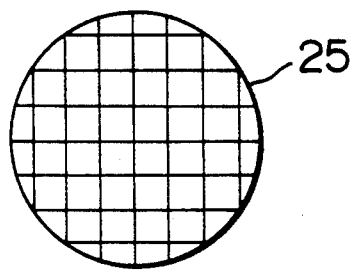
FIG. 8 is a plan view of a phantom standing for an object to be imaged.
Figure 9A:
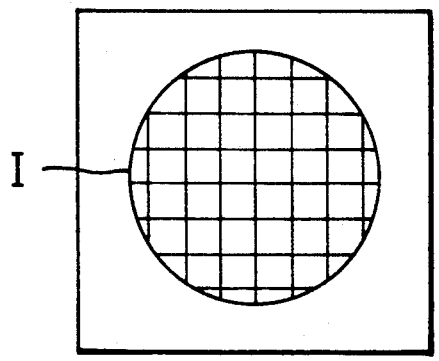
FIGS. 9A and 9B are diagrams for explaining a correct image and a distorted image which are obtained by imaging the phantom.
Figure 9B:
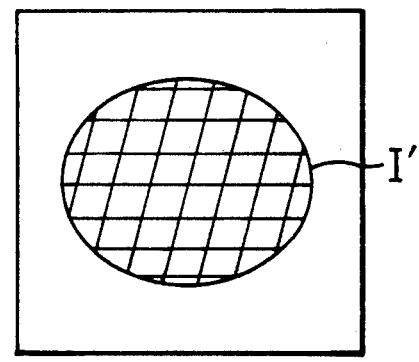

According to method and apparatus of stabilizing uniformity of a static magnetic field of the invention, in the magnetic resonance imaging apparatus having the above-described construction, predetermined gradient magnetic fields in the form of a pulse of short application time are applied from the gradient magnetic field generating system 3 to the static magnetic field generating magnetic circuit 2 before adjustment of uniformity of a static magnetic field of the static magnetic field generating magnetic circuit 2 and before each imaging operation for tomographic image of an object 1 under examination so as to provide constant magnetization for the static magnetic field generating magnetic circuit. More specifically, before adjustment of uniformity of the static magnetic field is achieved by adjusting mechanical configuration and positional relation in the construction of the static magnetic field generating magnetic circuit 2 during installation, maintenance or inspection of the apparatus and before the object 1 under examination is inserted into the measurement space and actually imaged for tomographic image, predetermined gradient magnetic fields are applied from the gradient magnetic field coils 9 of the gradient magnetic field generating system 3 to the magnetic pole pieces 24a and 24b (see FIG. 7) so as to provide constant magnetization for the magnetic pole pieces. The reason why the gradient magnetic field in the form of a pulse is applied is that magnetization can be changed on the hysteresis loop of the static magnetic field generating magnetic circuit more greatly by the pulse-like gradient magnetic field than by the gradient field of long application time applied during actual imaging.

In the static magnetic field uniformity stabilizing method, the gradient magnetic fields are applied at timings as explained with reference to FIG. 2. In the figure, abscissa represents time and ordinate intensity of the gradient field. Initially, before adjustment of uniformity of the static magnetic field of the static magnetic field generating magnetic circuit 2 and before the examined object 1 is imaged for tomographic image, gradient magnetic fields Gx, Gy and Gz of, for example, $-8$ milli-Tesla/meter intensity are applied, for example, three times as shown in FIG. 2 by means of the gradient magnetic field coils 9 driven by the gradient magnetic field power supplies 10. Subsequently, gradient magnetic fields Gx, Gy and Gz of, for example, $+8$ milli-Tesla/meter are applied, for example, five times. In this case, each pulse of each of the gradient magnetic fields Gx, Gy and Gz has an application time of, for example, 3 milliseconds and an application period of, for example, 150 milliseconds. The reason why the pulse-like gradient magnetic field is applied a plurality of times is that magnetization of the magnetic pole pieces 24a and 24b changes little by little.

Figure 10:
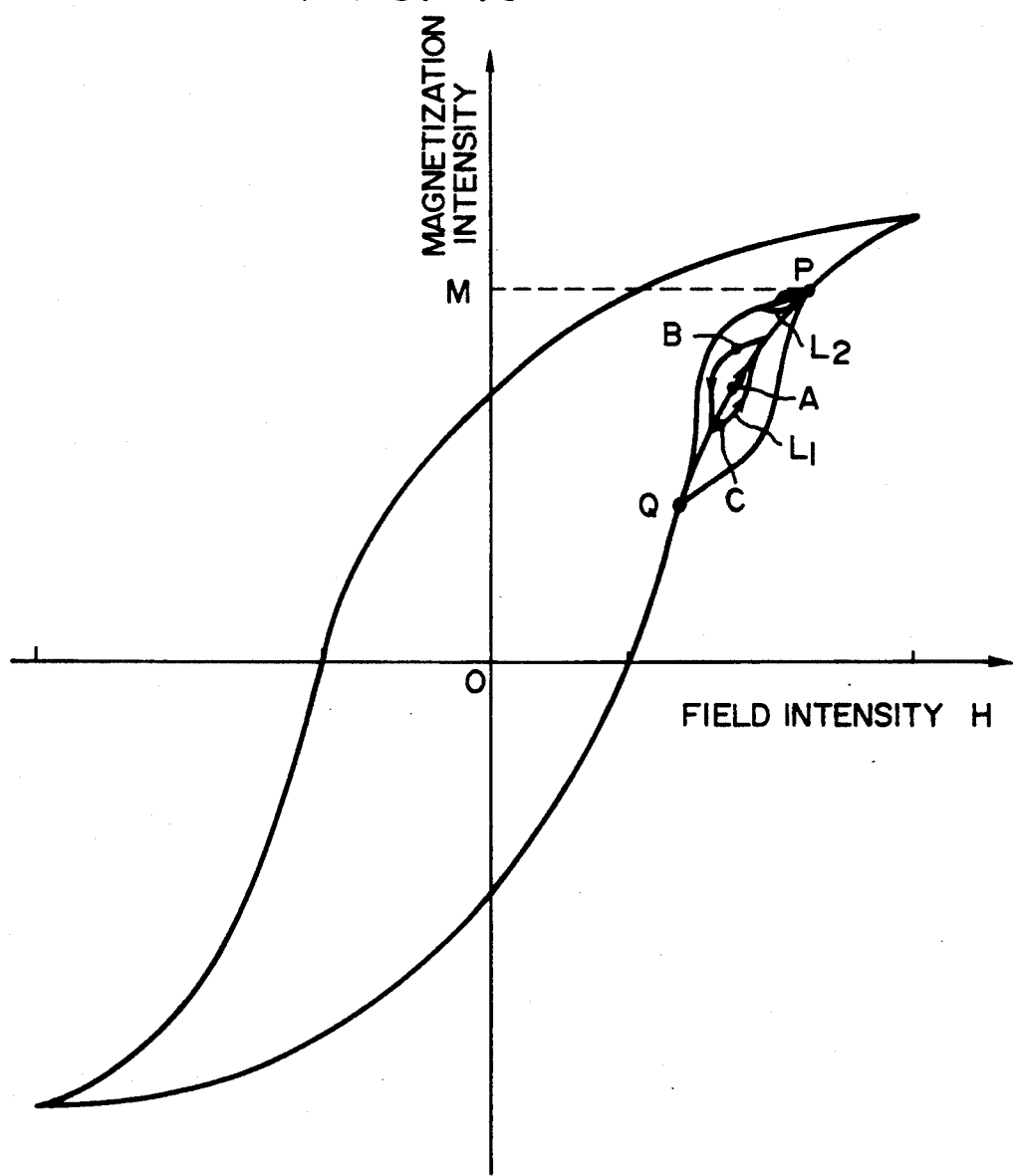
FIG. 10 is a graph showing an example of a magnetic hysteresis curve illustrative of the state of magnetization of a ferromagnetic material.

In this manner, constant magnetization is always applied to the magnetic pole pieces 24a and 24b of the static magnetic field generating magnetic circuit 2. Consequently, when adjustment of the magnetic field uniformity is conducted and imaging of the examined object 1 is conducted for tomographic image, the magnetic pole pieces 24a and 24b always take magnetization M at, for example, a point P on the magnetic hysteresis curve shown in FIG. 10, thus having constant magnetization. The intensity of the gradient magnetic fields Gx, Gy and Gz applied at that time is required to be larger than that of the gradient magnetic fields applied during actual imaging. Especially, it is preferable that the intensity amount to a value which can be applied at a maximum output level of the gradient magnetic field power supplies 10 shown in FIG. 10. In this case, magnetization intensity of the magnetic pole pieces 24a and 24b approximates the maximum magnetization intensity. Thus, even when a gradient magnetic field in positive direction is applied, magnetization of the magnetic pole pieces 24a and 24b will not change in the positive direction beyond the point P. When a gradient magnetic field is applied in negative direction, magnetization of the magnetic pole pieces 24a and 24b changes in the negative direction from the point P but since this change takes place along a hysteresis loop L2 which is part of a sightly inclined portion of the hysteresis curve, the amount of change of magnetization is small and the magnetization of the magnetic pole pieces 24a and 24b is stabilized. Accordingly, the factor of disturbance of the static magnetic field uniformity can be minimized. After gradient magnetic fields Gx, Gy and Gz are applied as shown in FIG. 2, adjustment of mechanical configuration and positional relation in the construction of the static magnetic field generating magnetic circuit 2, including adjustment of height and gap of the magnetic pole pieces 24a and 24b and adjustment of right/left positional displacement, is conducted so that the static magnetic field may not be distorted and may be generated in uniform state. In imaging the object 1 under examination for tomographic image, the gradient magnetic fields as shown in FIG. 2 are applied before each imaging operation to ensure that magnetization intensity of the magnetic pole pieces 24a and 24b can always be constant and thereafter imaging is carried out. As a result, when the object 1 under examination is imaged for tomographic image, the magnetic pole pieces 24a and 24b have magnetization which is in the same condition as that obtained when the static magnetic field uniformity is adjusted. Accordingly, static magnetic field uniformity upon imaging does not change from that obtained immediately after the adjustment and can be stabilized, making it possible to obtain less distorted images.

Figure 4:
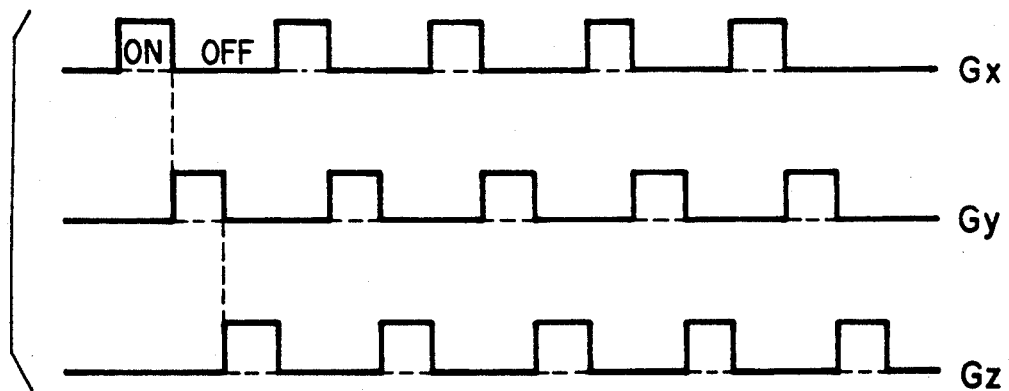
Figure 5:
Figure 6:
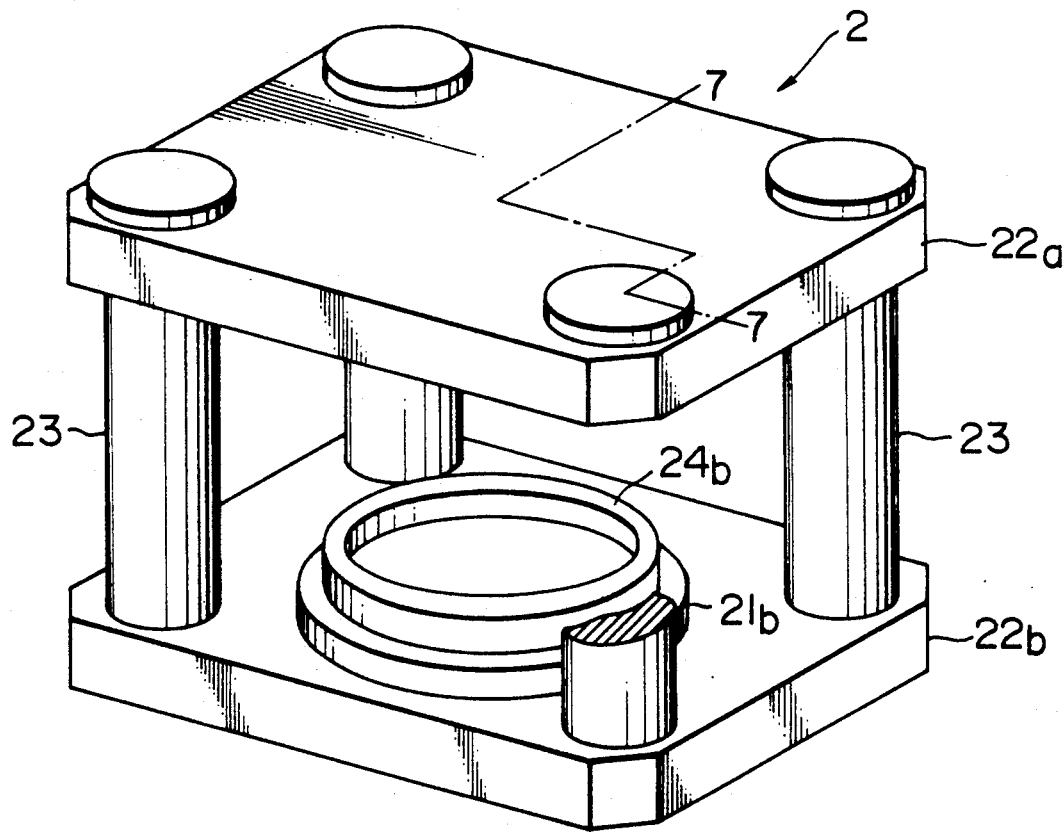
FIG. 6 is a perspective view showing a specific construction of a static magnetic field generating magnetic circuit.

FIGS. 3 to 5 are timing charts showing other embodiments of the application operation of the gradient magnetic fields. In FIG. 3, gradient magnetic fields Gx, Gy and Gz in the respective component directions are applied, for example, five times in only the positive direction. In this case, the magnetization intensity of the magnetic pole pieces 24a and 24b takes a value near the point P of FIG. 10. In FIG. 4, gradient magnetic fields Gx, Gy and Gz in the respective component directions are applied, for example, five times at slightly different timings in only the positive direction. In this case, the magnetic pole pieces 24a and 24b are magnetized sequentially by each of the gradient magnetic fields in the component directions X, Y and Z. Further, in FIG. 5, intensity of gradient magnetic fields Gx, Gy and Gz in the respective component directions is changed for each application in such a way that, for example, initial two applications are in negative direction and subsequent four applications are in positive direction. In this case, the magnetization intensity of the magnetic pole pieces 24a and 24b takes a value near the point P of FIG. 10.

In the timing chart shown in FIG. 2, the gradient magnetic fields Gx, Gy and Gz in the respective component directions are described as having $\pm 8$ milli-Tesla/meter intensity but the invention is not limited thereto, allowing the intensity to amount to, for example, $\pm 1$ milli-Tesla/meter to several of 10 milli-Tesla/meter depending on the condition of the static magnetic field generating magnetic circuit 2. In case where magnetization of the magnetic pole piece can be done with high efficiency, the application time of each of the gradient magnetic fields Gx, Gy and Gz, exemplified as 3 milliseconds in the foregoing, may be reduced to for example more than 0.1 millisecond to less than 1 milliseconds and the application period, previously exemplified as 150 milliseconds, may be reduced to for example more than 1 millisecond to less than 10 milliseconds.

In the present embodiment, the magnetization of the magnetic pole pieces is stabilized at the point P in the positive direction because total amount of the gradient magnetic fields which are applied in the positive direction during actual imaging sequence is larger than that of the gradient magnetic fields which are applied in the negative direction. If the application of the gradient magnetic fields in the negative direction is larger, it is preferable that the gradient magnetic fields of FIGS. 2 to 5 be inverted in their polarity and the magnetic pole piece be magnetized at the maximum value in the negative direction (point Q in FIG. 10).

We claim:

1. A method of stabilizing uniformity of a static magnetic field in a magnetic resonance imaging apparatus, comprising the steps of:
    applying predetermined gradient magnetic fields from gradient magnetic field generating means to static magnetic field generating means whereby said static magnetic field generating means is magnetized to a constant magnetization intensity; and
    adjusting the mechanical construction and position of said static magnetic field generating means magnetized to said constant magnetization intensity to obtain uniformity of the static magnetic field.

2. A static magnetic field uniformity stabilizing method according to claim 1 wherein said step of applying predetermined gradient magnetic fields includes:
    applying pulse-like gradient magnetic fields having field intensity larger than that of gradient magnetic fields applied during actual imaging.

3. A static magnetic field uniformity stabilizing method according to claim 2 wherein said step of applying predetermined gradient magnetic fields includes:
    applying gradient magnetic fields at a maximum output level of power supplies for generation of gradient magnetic fields.

4. A static magnetic field uniformity stabilizing method according to claim 3 wherein said step of applying predetermined gradient magnetic fields includes:
    applying gradient magnetic fields having an application time shorter than that of gradient magnetic fields applied during actual imaging.

5. A static magnetic field uniformity stabilizing method according to claim 4 wherein said step of applying predetermined gradient magnetic fields includes:
    initially applying gradient magnetic fields of minus (plus) polarity a plurality of times and subsequently applying gradient magnetic fields of plus (minus) polarity a plurality of times.

6. A static magnetic field uniformity stabilizing method according to claim 4 wherein said step of applying predetermined gradient magnetic fields includes:
    applying gradient magnetic fields of the same polarity a plurality of times.

7. A method of stabilizing uniformity of a static magnetic field in a magnetic resonance imaging apparatus, comprising the steps of:
    applying predetermined gradient magnetic fields from gradient magnetic field generating means to static magnetic field generating means, whereby said static magnetic field generating means is magnetized to constant magnetization intensity;
    applying a static magnetic field and gradient magnetic fields to an object under examination in predetermined pulse sequence;
    measuring an NMR signal generated from said object under examination; and
    reconstructing an image from said measured NMR signal.

8. A static magnetic field uniformity stabilizing method according to claim 7 wherein said step of applying predetermined gradient magnetic fields includes:
    applying pulse-like gradient magnetic fields having field intensity larger than that of gradient magnetic fields applied during actual imaging.

9. A static magnetic field uniformity stabilizing method according to claim 8 wherein said step of applying predetermined gradient magnetic fields includes:
    applying gradient magnetic fields at a maximum output level of power supplies for generation of gradient magnetic fields.

10. A static magnetic field uniformity stabilizing method according to claim 9 wherein said step of applying predetermined gradient magnetic fields includes:
    applying gradient magnetic fields having an application time shorter than that of gradient magnetic fields applied during actual imaging.

11. A static magnetic field uniformity stabilizing method according to claim 10 wherein said step of applying predetermined gradient magnetic fields includes:
    initially applying gradient magnetic fields of minus (plus) polarity a plurality of times and subsequently applying gradient magnetic fields of plus (minus) polarity a plurality of times.

12. A static magnetic field uniformity stabilizing method according to claim 10 wherein said step of applying predetermined gradient magnetic fields includes:
    applying gradient magnetic fields of the same polarity a plurality of times.

13. An apparatus of stabilizing uniformity of a static magnetic field in a magnetic resonance imaging apparatus, comprising:
    static magnetic field generating means;
    gradient magnetic field generating means;
    means for applying gradient magnetic fields from said gradient magnetic field generating means to said static magnetic field generating means, and for magnetizing said static magnetic field generating means to a constant magnetization intensity;
    means for applying a static magnetic field from said static magnetic field generating means and gradient magnetic fields from said gradient magnetic field generating means to an object under examination in predetermined pulse sequence;
    means for measuring an NMR signal generated from said object under examination; and
    means for reconstructing an image from said measured NMR signal.

14. A static magnetic field uniformity stabilizing apparatus according to claim 13 wherein said means for magnetizing said static magnetic field generating means to constant magnetization intensity includes:
    means for applying pulse-like gradient magnetic fields having field intensity larger than that of gradient magnetic fields applied during actual imaging.

15. A static magnetic field uniformity stabilizing apparatus according to claim 14 wherein said means for magnetizing said static magnetic field generating means to constant magnetization intensity includes:
    means for applying gradient magnetic fields at a maximum output level of power supplies for generation of gradient magnetic fields.

16. A static magnetic field uniformity stabilizing apparatus according to claim 15 wherein said means for magnetizing said static magnetic field generating means to a constant magnetization intensity includes:
    means for applying gradient magnetic fields having an application time shorter than that of gradient magnetic fields applied during actual imaging.

17. A static magnetic field uniformity stabilizing apparatus according to claim 16 wherein said means for magnetizing said static magnetic field generating means to constant magnetization intensity includes:
    means for initially applying gradient magnetic fields of minus (plus) polarity a plurality of times and subsequently applying gradient magnetic field of plus (minus) polarity a plurality of times.

18. A static magnetic field uniformity stabilizing apparatus according to claim 16 wherein said means for magnetizing said static magnetic field generating means to constant magnetization intensity includes:
    means for applying gradient magnetic fields of the same polarity a plurality of times.

* * * * *